US006717158B1

(12) United States Patent
Gat et al.

(10) Patent No.: US 6,717,158 B1
(45) Date of Patent: Apr. 6, 2004

(54) HEATING DEVICE FOR HEATING SEMICONDUCTOR WAFERS IN THERMAL PROCESSING CHAMBERS

(75) Inventors: Arnon Gat, Palo Alto, CA (US); Bob Bogart, Pacifica, CA (US); Conor Patrick O'Carroll, Sunneyvale, CA (US); Paul Janis Timans, Mountain View, CA (US); Shuen Chun Choy, San Francisco, CA (US); Zion Koren, Cupertino, CA (US); Chris Francis Bragg, Oakland, CA (US)

(73) Assignee: Mattson Technology, Inc., Fremont, CA (US)

( * ) Notice: Subject to any disclaimer, the term of this patent is extended or adjusted under 35 U.S.C. 154(b) by 0 days.

(21) Appl. No.: 09/478,247

(22) Filed: Jan. 6, 2000

(Under 37 CFR 1.47)

Related U.S. Application Data

(63) Continuation-in-part of application No. 09/226,396, filed on Jan. 6, 1999.

(51) Int. Cl.$^7$ ............................................. H01L 21/00
(52) U.S. Cl. ..................... 250/492.2; 392/416; 219/411
(58) Field of Search ................. 392/416, 441; 219/405, 411; 250/492.2

(56) References Cited

U.S. PATENT DOCUMENTS

| 3,623,712 A | 11/1971 | McNeilly et al. |
| 3,761,678 A | 9/1973 | Eckles |
| 3,796,182 A | 3/1974 | Rosler |
| 3,830,194 A | 8/1974 | Benzing et al. |
| 3,836,751 A | 9/1974 | Anderson |
| 3,862,397 A | 1/1975 | Anderson et al. |
| 4,001,047 A | 1/1977 | Boah |
| 4,041,278 A | 8/1977 | Boah |
| 4,047,496 A | 9/1977 | McNeilly et al. |

(List continued on next page.)

FOREIGN PATENT DOCUMENTS

| EP | 0308388 A1 | 3/1989 |
| EP | 0468874 A2 | 1/1992 |
| EP | 0476307 A | 3/1992 |

(List continued on next page.)

*Primary Examiner*—Kiet T. Nguyen
(74) *Attorney, Agent, or Firm*—Dority & Manning, P.A.

(57) ABSTRACT

An apparatus for heat treating semiconductor wafers is disclosed. The apparatus includes a heating device which contains an assembly of light energy sources for emitting light energy onto a wafer. The light energy sources can be placed in various configurations. In accordance with the present invention, tuning devices which are used to adjust the overall irradiance distribution of the light energy sources are included in the heating device. The tuning devices can be either active sources of light energy or passive sources which reflect, refract or absorb light energy. For instance, in one embodiment, the tuning devices can comprise a lamp spaced from a focusing lens designed to focus determined amounts of light energy onto a particular location of a wafer being heated.

15 Claims, 7 Drawing Sheets

U.S. PATENT DOCUMENTS

| | | |
|---|---|---|
| 4,048,955 A | 9/1977 | Anderson |
| 4,081,313 A | 3/1978 | McNeilly et al. |
| 4,097,226 A | 6/1978 | Erikson et al. |
| 4,115,163 A | 9/1978 | Gorina et al. |
| 4,184,065 A | 1/1980 | Nagashima |
| 4,221,956 A | 9/1980 | Fielding et al. |
| 4,224,504 A | 9/1980 | Erikson et al. |
| 4,389,970 A | 6/1983 | Edgerton |
| 4,436,985 A | 3/1984 | Weber |
| 4,446,817 A | 5/1984 | Crawley |
| 4,470,369 A | 9/1984 | Edgerton |
| 4,477,718 A | 10/1984 | Crain et al. |
| 4,496,828 A | 1/1985 | Kusmierz et al. |
| 4,504,323 A | 3/1985 | Arai et al. |
| 4,504,730 A | 3/1985 | Shimizu |
| 4,508,960 A | 4/1985 | Arai |
| 4,511,788 A | 4/1985 | Arai et al. |
| 4,517,448 A | 5/1985 | Crain et al. |
| 4,533,820 A | 8/1985 | Shimizu |
| 4,540,876 A | 9/1985 | McGinty |
| 4,543,472 A | 9/1985 | Arai et al. |
| 4,544,418 A | 10/1985 | Gibbons |
| 4,545,327 A | 10/1985 | Campbell et al. |
| 4,550,245 A | 10/1985 | Arai et al. |
| 4,551,616 A | 11/1985 | Buttery |
| 4,558,660 A | 12/1985 | Nishizawa et al. |
| 4,567,352 A | 1/1986 | Mimura et al. |
| 4,571,486 A | 2/1986 | Arai et al. |
| 4,581,520 A | 4/1986 | Vu et al. |
| 4,607,591 A | 8/1986 | Stitz |
| 4,615,294 A | 10/1986 | Scapple et al. |
| 4,632,056 A | 12/1986 | Stitz et al. |
| 4,632,057 A | 12/1986 | Price et al. |
| 4,640,224 A | 2/1987 | Bunch et al. |
| 4,642,243 A | 2/1987 | Yamazaki |
| 4,649,261 A | 3/1987 | Sheets |
| 4,653,428 A | 3/1987 | Wilson et al. |
| 4,654,509 A | 3/1987 | Robinson et al. |
| 4,680,451 A | 7/1987 | Gat et al. |
| 4,694,143 A | 9/1987 | Nishimura et al. |
| 4,698,486 A | 10/1987 | Sheets |
| 4,761,538 A | 8/1988 | Chiba et al. |
| 4,789,771 A | 12/1988 | Robinson et al. |
| 4,796,562 A | 1/1989 | Brors et al. |
| 4,806,321 A | 2/1989 | Nishizawa et al. |
| 4,817,558 A | 4/1989 | Itoh |
| 4,820,377 A | 4/1989 | Davis et al. |
| 4,820,906 A | 4/1989 | Stultz |
| 4,830,700 A | 5/1989 | Davis et al. |
| 4,832,777 A | 5/1989 | Davis et al. |
| 4,832,778 A | 5/1989 | Davis et al. |
| 4,832,779 A | 5/1989 | Fisher et al. |
| 4,836,138 A | 6/1989 | Robinson et al. |
| 4,854,263 A | 8/1989 | Chang et al. |
| 4,857,139 A | 8/1989 | Tashiro et al. |
| 4,857,704 A | 8/1989 | Jannot et al. |
| 4,859,832 A | 8/1989 | Uehara et al. |
| 4,901,670 A | 2/1990 | Ahlgren |
| 4,908,495 A | 3/1990 | Ishii et al. |
| 4,911,103 A | 3/1990 | Davis et al. |
| 4,913,929 A | 4/1990 | Moslehi et al. |
| 4,919,077 A | 4/1990 | Oda et al. |
| 4,920,918 A | 5/1990 | Adams et al. |
| 4,924,073 A | 5/1990 | Chiba |
| 4,924,807 A | 5/1990 | Nakayama et al. |
| 4,956,538 A | 9/1990 | Moslehi |
| 4,958,061 A | 9/1990 | Wakabayashi et al. |
| 4,975,561 A | 12/1990 | Robinson et al. |
| 4,979,466 A | 12/1990 | Nishitani et al. |
| 4,981,815 A | 1/1991 | Kakoschke |
| 4,985,281 A | 1/1991 | Ahlgren |
| 4,989,544 A | 2/1991 | Yoshikawa |
| 5,000,113 A | 3/1991 | Wang et al. |
| 5,011,794 A | 4/1991 | Grim et al. |
| 5,038,395 A | 8/1991 | Lenski |
| 5,044,943 A | 9/1991 | Bowman et al. |
| 5,047,611 A | 9/1991 | Stultz |
| 5,053,247 A | 10/1991 | Moore |
| 5,057,668 A | 10/1991 | Gisdakis et al. |
| 5,073,698 A | 12/1991 | Stultz |
| 5,085,887 A | 2/1992 | Adams et al. |
| 5,108,792 A | 4/1992 | Anderson et al. |
| 5,113,929 A | 5/1992 | Nakagawa et al. |
| 5,129,360 A | 7/1992 | Ahern et al. |
| 5,148,714 A | 9/1992 | McDiarmid |
| 5,154,512 A | 10/1992 | Schietinger et al. |
| 5,155,337 A | 10/1992 | Sorrell et al. |
| 5,156,820 A | 10/1992 | Wong et al. |
| 5,160,545 A | 11/1992 | Maloney et al. |
| 5,179,677 A | 1/1993 | Anderson et al. |
| 5,188,058 A | 2/1993 | Nakai |
| 5,194,401 A | 3/1993 | Adams et al. |
| 5,207,835 A | 5/1993 | Moore |
| 5,215,588 A | 6/1993 | Rhieu |
| 5,244,501 A | 9/1993 | Nakayama et al. |
| 5,252,132 A | 10/1993 | Oda et al. |
| 5,252,366 A | 10/1993 | Ahern et al. |
| 5,259,881 A | 11/1993 | Edwards et al. |
| 5,268,989 A | 12/1993 | Moslehi et al. |
| 5,269,847 A | 12/1993 | Anderson et al. |
| 5,288,364 A | 2/1994 | Burt et al. |
| 5,305,417 A | 4/1994 | Najm et al. |
| 5,308,161 A | 5/1994 | Stein |
| 5,314,538 A | 5/1994 | Maeda et al. |
| 5,315,092 A | 5/1994 | Takahashi et al. |
| 5,317,492 A | 5/1994 | Gronet et al. |
| 5,326,171 A * | 7/1994 | Thompson et al. .......... 374/121 |
| 5,332,442 A | 7/1994 | Kubodera et al. |
| 5,332,883 A | 7/1994 | Higashira |
| 5,345,534 A | 9/1994 | Najm et al. |
| 5,348,587 A | 9/1994 | Eichman et al. |
| 5,364,667 A | 11/1994 | Rhieu |
| 5,366,554 A | 11/1994 | Kanai et al. |
| 5,367,606 A | 11/1994 | Moslehi et al. |
| 5,372,648 A | 12/1994 | Yamomoto et al. |
| 5,380,682 A | 1/1995 | Edwards et al. |
| 5,414,244 A | 5/1995 | Imahashi |
| 5,418,885 A | 5/1995 | Hauser et al. |
| 5,444,217 A | 8/1995 | Moore et al. |
| 5,444,815 A | 8/1995 | Lee et al. |
| 5,445,675 A | 8/1995 | Kubodera et al. |
| 5,446,824 A | 8/1995 | Moslehi |
| 5,446,825 A | 8/1995 | Moslehi et al. |
| 5,449,883 A | 9/1995 | Tsuruta |
| 5,451,260 A | 9/1995 | Versteeg et al. |
| 5,478,609 A | 12/1995 | Okamura |
| 5,480,489 A | 1/1996 | Hasegawa |
| 5,482,557 A | 1/1996 | Kanai et al. |
| 5,493,987 A | 2/1996 | McDiarmid et al. |
| 5,501,739 A | 3/1996 | Yamada et al. |
| 5,505,779 A | 4/1996 | Mizuno et al. |
| 5,518,549 A | 5/1996 | Hellwig |
| 5,525,160 A | 6/1996 | Tanaka et al. |
| 5,534,072 A | 7/1996 | Mizuno et al. |
| 5,539,855 A | 7/1996 | Takahashi et al. |
| 5,551,982 A | 9/1996 | Anderson et al. |
| 5,551,985 A | 9/1996 | Brors et al. |
| 5,561,735 A | 10/1996 | Camm |
| 5,565,382 A | 10/1996 | Tseng et al. |
| 5,571,749 A | 11/1996 | Matsuda et al. |
| 5,576,059 A | 11/1996 | Beinglass et al. |

| | | | | | | |
|---|---|---|---|---|---|---|
| 5,587,019 A | 12/1996 | Fujie | | JP | 60-253939 | 12/1985 |
| 5,595,606 A | 1/1997 | Fujikawa et al. | | JP | 61-196515 | 8/1986 |
| 5,599,397 A | 2/1997 | Anderson et al. | | JP | 61-199631 | 9/1986 |
| 5,609,689 A | 3/1997 | Kato et al. | | JP | 62-20308 | 1/1987 |
| 5,624,499 A | 4/1997 | Mizuno et al. | | JP | 62-33418 | 2/1987 |
| 5,624,590 A | 4/1997 | Fiory | | JP | 62-46516 | 2/1987 |
| 5,635,409 A | 6/1997 | Moslehi | | JP | 63-39930 | 3/1988 |
| 5,683,173 A | 11/1997 | Gronet et al. | | JP | 63-143814 | 6/1988 |
| 5,689,614 A | 11/1997 | Gronet et al. | | JP | 63-149524 | 10/1988 |
| 5,930,456 A | 7/1999 | Vosen | | JP | 63-260127 | 10/1988 |
| | | | | JP | 63-263719 | 10/1988 |
| | | | | JP | 63-269515 | 11/1988 |

FOREIGN PATENT DOCUMENTS

| | | | | | |
|---|---|---|---|---|---|
| EP | 0576791 A | 1/1994 | JP | 64-11324 | 1/1989 |
| EP | 4306398 A | 9/1994 | JP | 64-90525 | 4/1989 |
| GB | 2180989 B | 5/1989 | JP | 1-204114 | 8/1989 |
| JP | 58-24788 | 2/1983 | JP | 1-239428 | 9/1989 |
| JP | 59-17253 | 1/1984 | | | |
| JP | 60-727 | 1/1985 | | | |

\* cited by examiner

HEATING DEVICE FOR HEATING SEMICONDUCTOR WAFERS IN THERMAL PROCESSING CHAMBERS

RELATED APPLICATIONS

The present application is a Continuation In Part Application of U.S. Ser. No. 09/226,396 filed on Jan. 6, 1999.

FIELD OF THE INVENTION

The present invention is generally directed to thermal processing chambers for heating semiconductor wafers using light energy. More particularly, the present invention is directed to improved heating lamp configurations containing tuning devices which are used to more uniformly heat semiconductor wafers.

BACKGROUND OF THE INVENTION

A thermal processing chamber as used herein refers to a device that rapidly heats objects, such as semiconductor wafers. Such devices typically include a substrate holder for holding a semiconductor wafer and a light source that emits light energy for heating the wafer. During heat treatment, the semiconductor wafers are heated under controlled conditions according to a preset temperature regime. For monitoring the temperature of the semiconductor wafer during heat treatment, thermal processing chambers also typically include temperature sensing devices, such as pyrometers, that sense the radiation being emitted by the semiconductor wafer at a selected band of wavelengths. By sensing the thermal radiation being emitted by the wafer, the temperature of the wafer can be calculated with reasonable accuracy.

In alternative embodiments, instead of or in addition to using radiation sensing devices, thermal processing chambers can also contain thermocouples for monitoring the temperature of the wafers. Thermocouples measure the temperature of objects by direct contact.

Many semiconductor heating processes require a wafer to be heated to high temperatures so that various chemical and physical reactions can take place as the wafer is fabricated into a device. During rapid thermal processing, which is one type of processing, semiconductor wafers are typically heated by an array of lights to temperatures, for instance, from about 400° C. to about 1,200° C., for times which are typically less than a few minutes. During these processes, one main goal is to heat the wafers as uniformly as possible.

Problems have been experienced in the past, however, in being able to maintain a constant temperature throughout the wafer and in being able to control the rate at which the wafer is heated. If the wafer is heated nonuniformly, various unwanted stresses can develop in the wafer. Not being able to heat the wafers uniformly also limits the ability to uniformly deposit films on the wafers, to uniformly etch the wafers, beside limiting the ability to perform various other chemical and physical processes on the wafers.

Temperature gradients can be created within the wafer due to various factors. For instance, due to the increased surface area to volume ratio, the edges of semiconductor wafers tend to have a cooling rate and a heating rate that are different than the center of the wafer. The energy absorption characteristics of wafers can also vary from location to location. Additionally, when gases are circulated in the chamber, the gases can create cooler areas on the wafer due to convection.

In the past, various lamp configurations have been proposed in order to overcome the above described deficiencies and improve the ability to heat wafers more uniformly and to control the temperature of the wafers at various locations. These systems, however, have become increasingly complex and expensive to produce. For instance, some systems can contain well over 100 lamps.

As such, a need currently exists for an improved thermal processing chamber that is capable of uniformly heating semiconductor wafers in a relatively simple manner without being as complex as many prior art systems. A need also exists for an improved rapid thermal processing chamber for heating semiconductor wafers that is equipped with controls for varying the amount of energy that is applied to the wafer at different locations based upon the characteristics and properties of the wafer. Such controls are especially necessary due to the increasing demands that are being placed upon the preciseness at which the semiconductor wafers are heat treated and at which semiconductor devices are fabricated.

SUMMARY OF THE INVENTION

The present invention recognizes and addresses the foregoing disadvantages and others of prior art constructions and methods.

Accordingly, it is an object of the present invention to provide an improved thermal processing chamber for heat treating semiconductor wafers.

Another object of the present invention is to provide a thermal processing chamber having an improved lamp configuration for heating the wafers uniformly.

Still another object of the present invention to provide a heating device for use in thermal processing chambers that contains a plurality of lamps which form overlapping heating zones on a wafer being heated.

Another object of the present invention is to provide a heating device for use in thermal processing chambers that contains tuning devices spaced between heating lamps for uniformly heating wafers with high levels of controllability.

It is another object of the present invention to provide a heating device for use in thermal processing chambers that not only contains lamps for heating semiconductor wafers but also contains a tuning device for heating the wafers more uniformly, wherein the tuning device comprises a lamp in operative association with or without a focusing lens which is used to direct light energy being emitted by the lamp onto a determined area of the semiconductor wafer.

Another object of the present invention is to provide a heating device for use in thermal processing chambers containing a plurality of lamps for heating a semiconductor wafer and at least one passive optical element placed amongst the lamps which redirects light energy being emitted by the lamps for heating semiconductor wafers more uniformly.

Still another object of the present invention is to provide a heating device for use in thermal processing chambers that contains passive optical elements having a ruled prismatic surface which is positioned within the heating device in order to redirect light energy being emitted by the heating device onto a semiconductor wafer in a manner that heats the wafer more uniformly.

These and other objects of the present invention are achieved by providing an apparatus for heat treating semiconductor wafers. The apparatus includes a thermal processing chamber adapted to contain a semiconductor wafer. For instance, a substrate holder can be contained within the chamber upon which the wafer is held. A heating device is placed in communication with the thermal processing chamber which emits thermal light energy onto the wafer held on the substrate holder. The heating device can include an assembly of light energy sources which are positioned, for instance, to heat different zones of the wafer. The light energy sources form an irradiance distribution across a surface of the wafer.

More particularly, during the heating process, either the semiconductor wafer can be rotated or the light energy sources can be rotated. In this manner, the light energy sources form radial heating zones on the wafer which aid in heating the wafer uniformly and provide good temporal control during the heating cycle.

In accordance with the present invention, the heating device further includes at least one tuning device positioned amongst the light energy sources. The tuning device is configured to change the irradiance distribution of the light energy sources in a manner for more uniformly heating the semiconductor wafer. The tuning device can be an active device which emits light radiation onto a determined location of the wafer or can be a passive device, which redirects light radiation being emitted by the light energy sources contained in the heating device for adjusting the irradiance distribution of the light energy sources.

In one example of an active device, the tuning device includes a light energy source spaced from one or more focusing lenses. The focusing lens is configured to focus light energy being emitted by the light energy source onto a determined location of the wafer. The light energy source and the focusing lens can be mounted to a movable support structure. The support structure can be movable for directing the light energy being emitted by the tuning device onto different locations as desired depending upon the particular application. In general, the tuning device is used to supply light energy to the wafer in areas where further heating is desired in order to compensate for any nonuniformities in the irradiance distribution of the plurality of light energy sources.

In one embodiment, the support structure to which the light energy source is mounted includes a tiltable lever arm. The lever arm is tiltable for directing light energy being emitted by the tuning device to a particular location.

The system of the present invention can include as many tuning devices as are required for uniformly heating wafers. The number of tuning devices incorporated into a particularly system will generally depend upon numerous factors, including the configuration of the light energy sources. In one embodiment, the light energy sources can be placed in concentric rings and tuning devices can be placed in between the rings of lamps.

In order to control the amount of light energy that is emitted by the plurality of light energy sources, the apparatus of the present invention can include at least one temperature sensing device which senses the temperature of the wafer at a plurality of locations. For instance, the temperature sensing device can be a plurality of pyrometers, one pyrometer with multiple viewing ports, or one or more thermocouples. The temperature sensing devices can be in communication with a controller, such as a microprocessor, which determines the temperature of the wafer. The controller, in turn, can be in communication with the power supply of the light energy sources for controlling the amount of heat being emitted by the light energy sources in response to the temperature of the wafer. The controller can be configured, for instance, to control the amount of light energy being emitted by each light energy source or can control different groups of the light energy sources.

In one embodiment, the controller can be configured to also control the amount of light energy that is being emitted by a tuning device installed in accordance with the present invention. In particular, the controller can be used to control the tuning device independent of the light energy sources. Further, the controller can also be configured to be capable of automatically moving the support structure upon which the tuning device is mounted in order to change and adjust the location of where the light energy being emitted by the tuning device contacts the wafer.

The light energy sources used in the heating device of the present invention can be, for instance, lamps, such as tungsten-halogen lamps. The lamps can be substantially vertically oriented with respect to the semiconductor wafer, or can be oriented horizontally. In order to maintain the lamps in position, the lamps can be connected to a mounting base. The mounting base can include reflective devices for directing the light energy being emitted by the lamps onto the wafer. The reflective devices can be polished annular surfaces surrounding the lamps or, alternatively, can be in the shape of plates that extend adjacent to the lamps. For example, in one embodiment, the heating device includes reflective plates which extend beyond the length of the lamps in a direction perpendicular to the semiconductor wafer.

Besides using active tuning devices that emit light radiation, the present invention is also directed to the use of passive tuning devices which redirect light energy being emitted by the light energy sources. In particular, the light energy is redirected in a manner such that semiconductor wafers are heated more uniformly. In this embodiment, the tuning device can comprise an optical element positioned adjacent to at least one of the light energy sources. The optical element can be designed either to reflect, to absorb, or to refract light energy.

In one embodiment, the optical elements can include a ruled prismatic surface for reflecting light radiation in a specified manner. The ruled prismatic surface can have a fixed pitch and a fixed facet angle or a fixed pitch with a variable facet angle. The ruled prismatic surface can be made from a highly reflective material, such as a dielectric material or a metal, such as gold.

Besides having a ruled prismatic surface, in an alternative embodiment, the optical element can include a diffuse surface, which scatters light energy in all directions. The diffuse surface can be made from, for instance, a rough surface.

Preferably, the passive tuning device has an adjustable position with respect to the light energy sources contained in the heating device. For instance, in one embodiment, the tuning device can be placed at different angles with respect to the light energy sources and at a different height. For instance, the light energy sources can be all attached to a mounting base and can all be substantially vertically oriented. The tuning device can be designed to be insertable in and out of the mounting base so as to be positioned at a different height with respect to the light energy sources. The position of the tuning device can be controlled using a controller if desired.

Other objects, features and aspects of the present invention are discussed in greater detail below.

BRIEF DESCRIPTION OF THE DRAWINGS

A full and enabling disclosure of the present invention, including the best mode thereof, directed to one of ordinary skill in the art, is set forth more particularly in the remainder of the specification, which makes reference to the appended figures in which.

Figure 1:
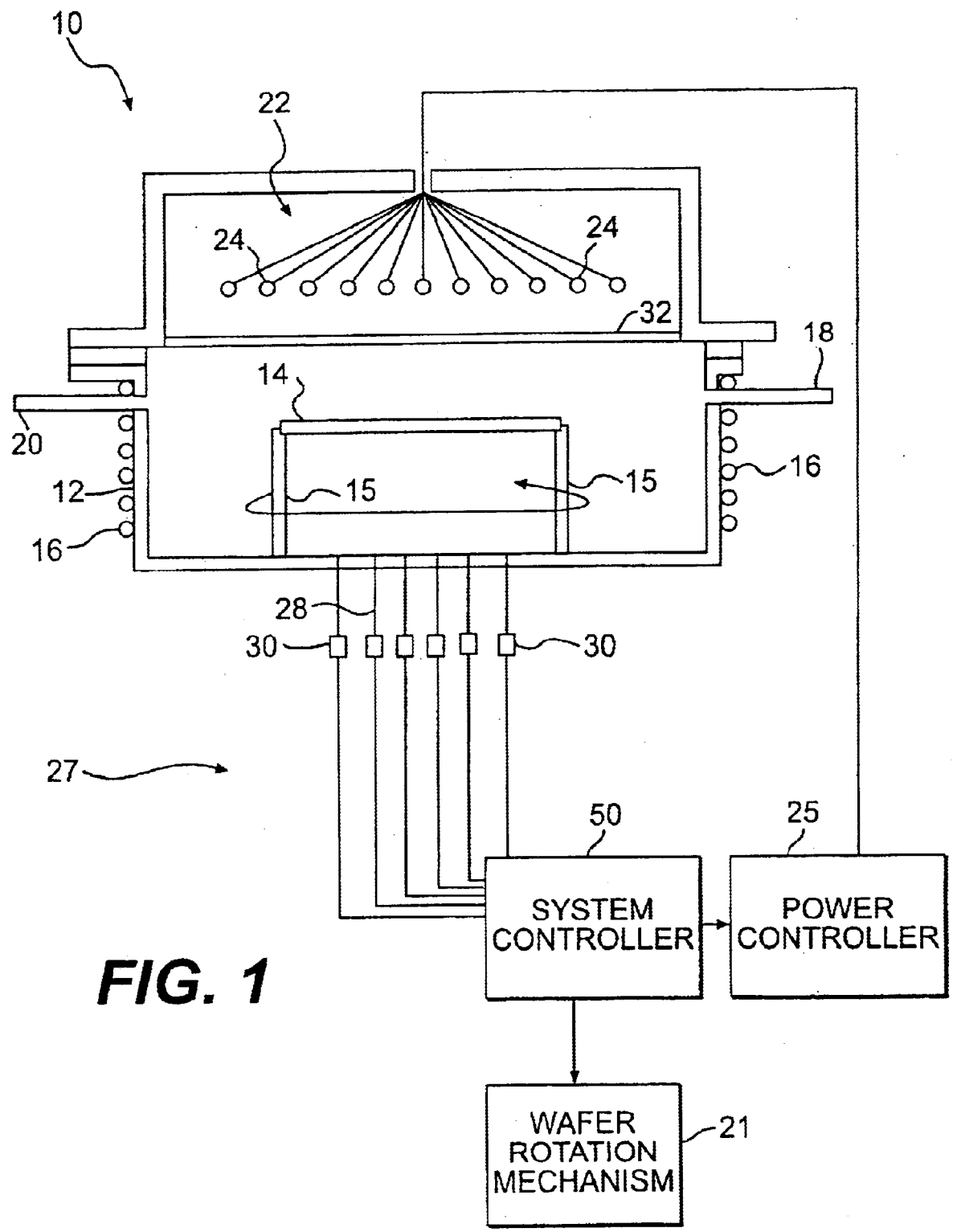
FIG. 1 is a cross-sectional view of one embodiment of a thermal processing chamber that may be used in accordance with the present invention.

Repeat use of references characters in the present specification and drawings is intended to represent same or analogous features or elements of the invention.

DETAILED DESCRIPTION OF THE PREFERRED EMBODIMENTS

It is to be understood by one of ordinary skill in the art that the present discussion is a description of exemplary embodiments only, and is not intended as limiting the broader aspects of the present invention, which broader aspects are embodied in the exemplary construction.

A rapid thermal processing apparatus uses intense light to heat a semiconductor wafer as part of the manufacturing process of integrated circuits. Exposure to light energy, which is also referred to herein as light energy, causes a rapid increase in the temperature of a semiconductor wafer and allows processing times to be relatively short. In rapid thermal processing systems, it is important to radiate the wafer with very high intensity light in a very uniform and controlled fashion. As stated above, the difficulty with current devices is that the requirements for the intensity of the radiated light and the ability to heat wafers uniformly are very difficult to achieve.

In general, the present invention is directed to an apparatus and method for heating semiconductor wafers uniformly and at a controlled rate. The apparatus includes a thermal processing chamber in communication with a heating device that is used to heat treat semiconductor wafers contained in the chamber. The heating device contains a plurality of lamps that are positioned at preselected locations for heating the wafers. In particular, the lamps emit light energy and form a irradiance distribution over the surface of the wafer.

During heating, the wafer is rotated with respect to the plurality of lamps. In this manner, the lamps form radial heating zones on the wafer. The energy supplied to each heating zone can be controlled while the wafer is being heated.

In one embodiment, the temperature at different locations of the wafer is monitored. Based upon the temperature sensed at the different locations, the energy being emitted by the lamps is selectively controlled.

In accordance with the present invention, the heating device in communication with the thermal processing chamber further contains tuning devices which are designed to modify the irradiance distribution of the heating lamps for more uniformly heating the semiconductor wafer. The tuning devices allow fine adjustments to be made to the wafer irradiance distribution pattern in order to heat the wafer under a more controlled temperature regime and more uniformly. The tuning device can be, in one embodiment, a localized and focused source of light energy that can be directed onto a particular location on the wafer. In an alternative embodiment, however, the tuning device can be a passive device which redirects light energy being emitted by the heating lamps in a manner that heats the wafer more uniformly.

For instance, the tunning device can be an active localized source such as a tungsten halogen bulb in an optical configuration or a laser diode with relatively high power. Alternatively, the tuning device can be a passive device that is used to distort and optimize the radiation of the light energy sources and create a desired uniform illumination.

Referring to FIG. 1, a system generally 10 made in accordance with the present invention for heat treating a wafer made from a semiconductive material, such as silicon, is illustrated. System 10 includes a processing chamber 12 adapted to receive substrates such as a wafer 14 for conducting various processes. As shown, wafer 14 is positioned on a substrate holder 15 made from a thermal insulating material such as quartz. Chamber 12 is designed to heat wafer 14 at very rapid rates and under carefully controlled conditions. Chamber 12 can be made from various materials, including metals and ceramics. For instance, chamber 12 can be made from stainless steel or quartz.

When chamber 12 is made from a heat conductive material, preferably the chamber includes a cooling system. For instance, as shown in FIG. 1, chamber 12 includes a cooling conduit 16 wrapped around the perimeter of the chamber. Conduit 16 is adapted to circulate a cooling fluid, such as water, which is used to maintain the walls of chamber 12 at a constant temperature.

Chamber 12 can also include a gas inlet 18 and a gas outlet 20 for introducing a gas into the chamber and/or for maintaining the chamber within a preset pressure range. For instance, a gas can be introduced into chamber 12 through gas inlet 18 for reaction with wafer 14. Once processed, the gas can then be evacuated from the chamber using gas outlet 20.

Alternatively, an inert gas can be fed to chamber 12 through gas inlet 18 for preventing any unwanted or undesirable side reactions from occurring within the chamber. In a further embodiment, gas inlet 18 and gas outlet 20 can be used to pressurize chamber 12. A vacuum can also be created in chamber 12 when desired, using gas outlet 20 or an additional larger outlet positioned beneath the level of the wafer.

During processing, substrate holder 15, in one embodiment, can be adapted to rotate wafer 14 using a wafer rotation mechanism 21. Rotating the wafer promotes greater temperature uniformity over the surface of the wafer and promotes enhanced contact between wafer 14 and any gases introduced into the chamber. It should be understood, however, that besides wafers, chamber 12 is also adapted to process optical parts, films, fibers, ribbons, and other substrates having any particular shape.

A heat source or heating device generally 22 is included in communication with chamber 12 for heating wafer 14 during processing. Heating device 22 includes a plurality of lamps 24, such as tungsten-halogen lamps. As shown in FIG. 1, lamps 24 are placed above wafer 14. It should be understood, however, that lamps 24 may be placed at any particular location. Further, additional lamps could be included within system 10 if desired.

The use of lamps 24 as a heat source is generally preferred. For instance, lamps have much higher heating and cooling rates than other heating devices, such as electrical elements or conventional furnaces. Lamps 24 create a rapid isothermal processing system that provide instantaneous energy, typically requiring a very short and well controlled start up period. The flow of energy from lamps 24 can also be abruptly stopped at any time. As shown in the figure, lamps 24 are equipped with a gradual power controller 25 that can be used to increase or decrease the light energy being emitted by any of the lamps.

In order to assist in directing the light energy being emitted by lamps 24 onto wafer 14, the lamps can be associated with a reflector or a set of reflectors. For instance, mounting base 34 can include a reflective surface that surrounds the lamps. In one embodiment, reflective angular recesses can be formed into a mounting base 34 for directing the light energy onto the wafer.

Figure 2:
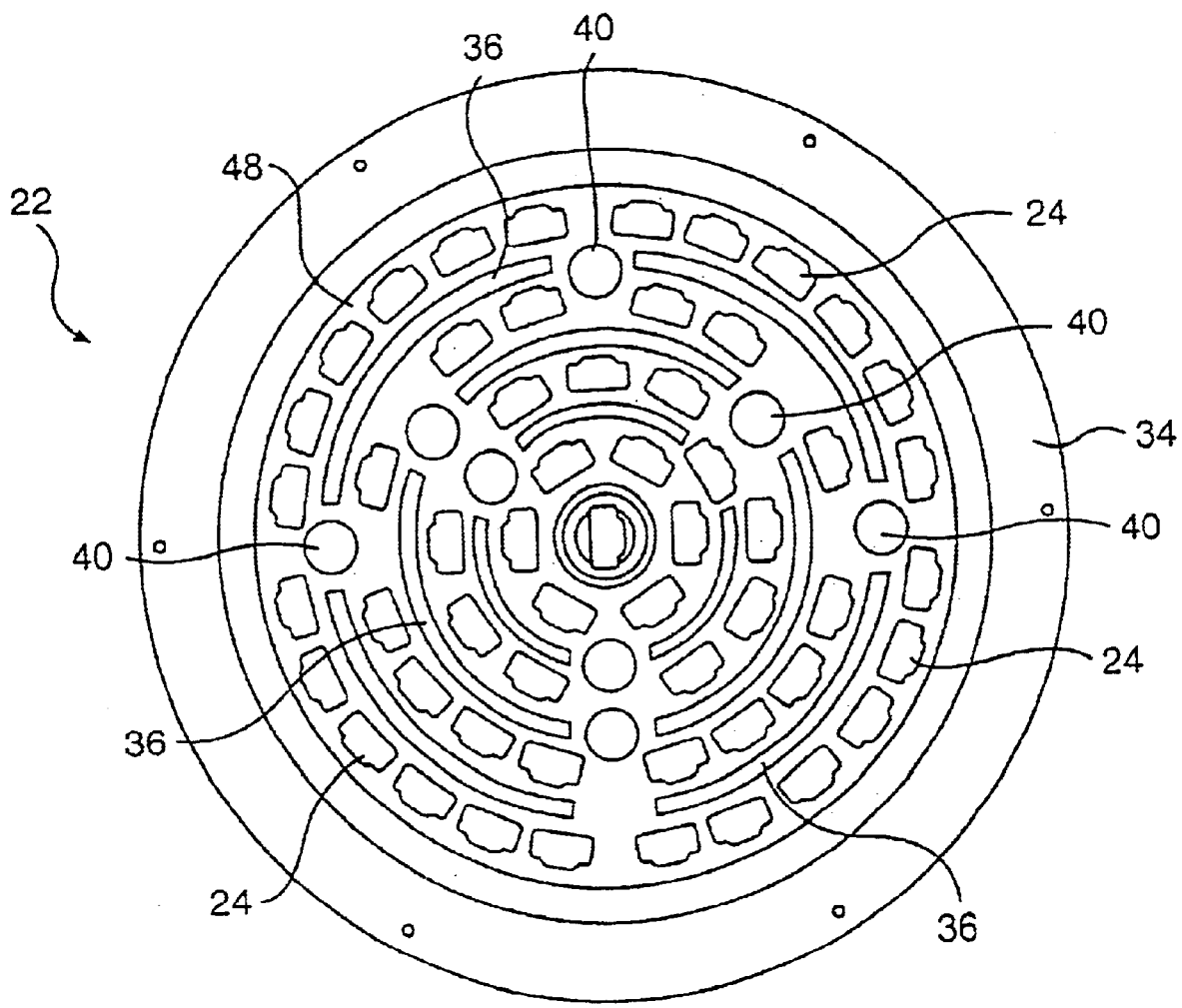
FIG. 2 is a plan view of one embodiment of a heating device that may be used in thermal processing chambers made in accordance with the present invention.

Referring to FIG. 2, in one alternative embodiment, heating device 22 can include arc-shaped reflector plates 36 which are located in between the concentric rings of lamps 24. Reflector plates 36 are substantially vertically oriented with respect to a wafer placed in communication with heating device 22 and extend at least a portion of the length of lamps 24. More particularly, arc-shaped reflector plates 36 can extend less than the length of lamps 24 about the same length as lamps 24 or beyond the length of lamps 24. Reflector plates 36 serve to direct the light energy being emitted by the concentric rings of lamps. Besides arc-shaped reflector plates 36, however, it should be understood that various other reflective devices may be used in heating device 22. For instance, various reflective devices are disclosed in U.S. Pat. No. 5,155,336, which is incorporated herein by reference. In particular, U.S. Pat. No. 5,155,336 disclosed the use of cylindrically shaped reflectors which guide the light rays.

In order to monitor the temperature of wafer 14 during the heating process, in this embodiment, thermal processing chamber 12 includes plurality of radiation sensing devices generally 27. Radiation sensing devices 27 include a plurality of optical fibers or light pipes 28 which are, in turn, in communication with a plurality of corresponding light detectors 30. Optical fibers 28 are configured to receive thermal energy being emitted by wafer 14 at a particular wavelength. The amount of sensed radiation is then communicated to light detectors 30 which generate a usable voltage signal for determining the temperature of the wafer which can be calculated based, in part, on Planck's Law. In one embodiment, each optical fiber 28 in combination with a light detector 30 comprises a pyrometer. In another embodiment, the optical fibers 28 are routed to a single but multiplexing radiation sensing device.

In general, thermal processing chamber 12 can contain one or a plurality of radiation sensing devices. In a preferred embodiment, as shown in FIG. 1, thermal processing chamber 12 contains a plurality of radiation sensing devices that measure the temperature of the wafer at different locations. Knowing the temperature of the wafer at different locations can then be used to control the amount of heat being applied to the wafer as will be described in more detail hereinafter. The amount of heat applied to various zones of the wafer can also be controlled in an open loop fashion. In this configuration the ratios between the various heating zones can be pre-determined after manual optimization. In subsequent processes, these ratios are used with no changes during the heating cycles.

During the process of the present invention, system 10 should be designed such that optical fibers 28 only detect thermal radiation being emitted by wafer 14 and not detect radiation being emitted by lamps 24. In this regard, system 10 includes a filter 32 which prevents thermal radiation being emitted by lamps 24 at the wavelength at which light detectors 30 operate from entering chamber 12. Filter 32 also serves to isolate lamps 24 from wafer 14 and prevent contamination of the chamber. Filter 32 as shown in FIG. 1 can be a window positioned between chamber 12 and heat source 22. In an alternative embodiment, each lamp 24 can be covered by a separate filter.

In one embodiment, filter 32 is made from fused silica or quartz. Fused silica is known to absorb thermal radiation very effectively at selected wavelengths. For instance, synthetic fused silica with high concentration of OH ions is very effective at absorbing light at a wavelength of from approximately 2.7 micrometers to about 2.8 micrometers. Thus, in one embodiment, when filter 32 is made from synthetic fused silica, light detectors 30 can be configured to detect thermal radiation being emitted by wafer 14 at a wavelength of about 2.7 micrometers. In other embodiments, the separation between radiation arriving to the sensor from the wafer and lamps is achieved by mechanical means of isolation. In these embodiments, buffers and shields are present to prevent a direct path from forming between a light source and a sensing port.

Besides using radiation sensing devices, other temperature sensing devices may be used in the system of the present invention. For instance, one or more thermocouples may be incorporated into the system for monitoring the temperature of the wafer at a single location or at a plurality of locations. The thermocouples can be placed in direct contact with the wafer or can be placed adjacent the wafer from which the temperature can be extrapolated.

System 10 further includes a system controller 50 which can be, for instance, a microprocessor. Controller 50 receives voltage signals from light detectors 30 that represent the radiation amounts being sampled at the various locations. Based on the signals received, controller 50 is configured to calculate the temperature of wafer 14 at different locations.

System controller 50 as shown in FIG. 1 can also be in communication with lamp power controller 25. In this arrangement, controller 50 can determine the temperature of wafer 14, and, based on this information, control the amount of thermal energy being emitted by lamps 24. In this manner, instantaneous adjustments can be made regarding the conditions within reactor 12 for processing wafer 14 within carefully controlled limits.

In one embodiment, controller 50 can also be used to automatically control other elements within the system. For instance, controller 50 can be used to control the flow rate of gases entering chamber 12 through gas inlet 18. As shown, controller 50 can further be used to control the rate at which wafer 14 is rotated within the chamber.

As described above, the present invention is generally directed to a particular heating configuration that is used within thermal processing chamber 12. Referring to FIG. 2, one embodiment of a heating device 22 that can be used in combination with thermal processing chamber 12 in accordance with the present invention is illustrated. As shown, heating device 22 includes a plurality of light energy sources, such as lamps 24 that are secured to a mounting base 34. In this embodiment, lamps 24 are arranged in five concentric rings which each serve to heat a separate radial zone on a wafer. It should be understood, however, that many other lamp configurations may be used without limitation.

In accordance with the present invention, in order to heat a wafer more uniformly, heating device 22 further includes tuning devices 40 which, in this embodiment, are generally positioned in between the concentric rings of lamps 24. Tuning devices 40 are designed to emit controlled and focused amounts of light energy onto particular locations of a semiconductor wafer being heated. The tuning devices are provided in order to make fine adjustments to the irradiance distribution produced by lamps 24 in order to more precisely heat the wafers. For example, tuning devices 40 can be used to emit controlled amounts of light energy between the radial heating zones located on the wafer.

Tuning devices 40 as shown in FIG. 2 are active localized sources of focused light energy. The tuning devices can be, for instance, laser diodes having a relatively high power. In an alternative embodiment, as shown in FIG. 3, tuning devices 40 can be a lamp, such as a tungsten halogen lamp or arc lamp, in operative association with one or more focusing lenses.

Figure 3:
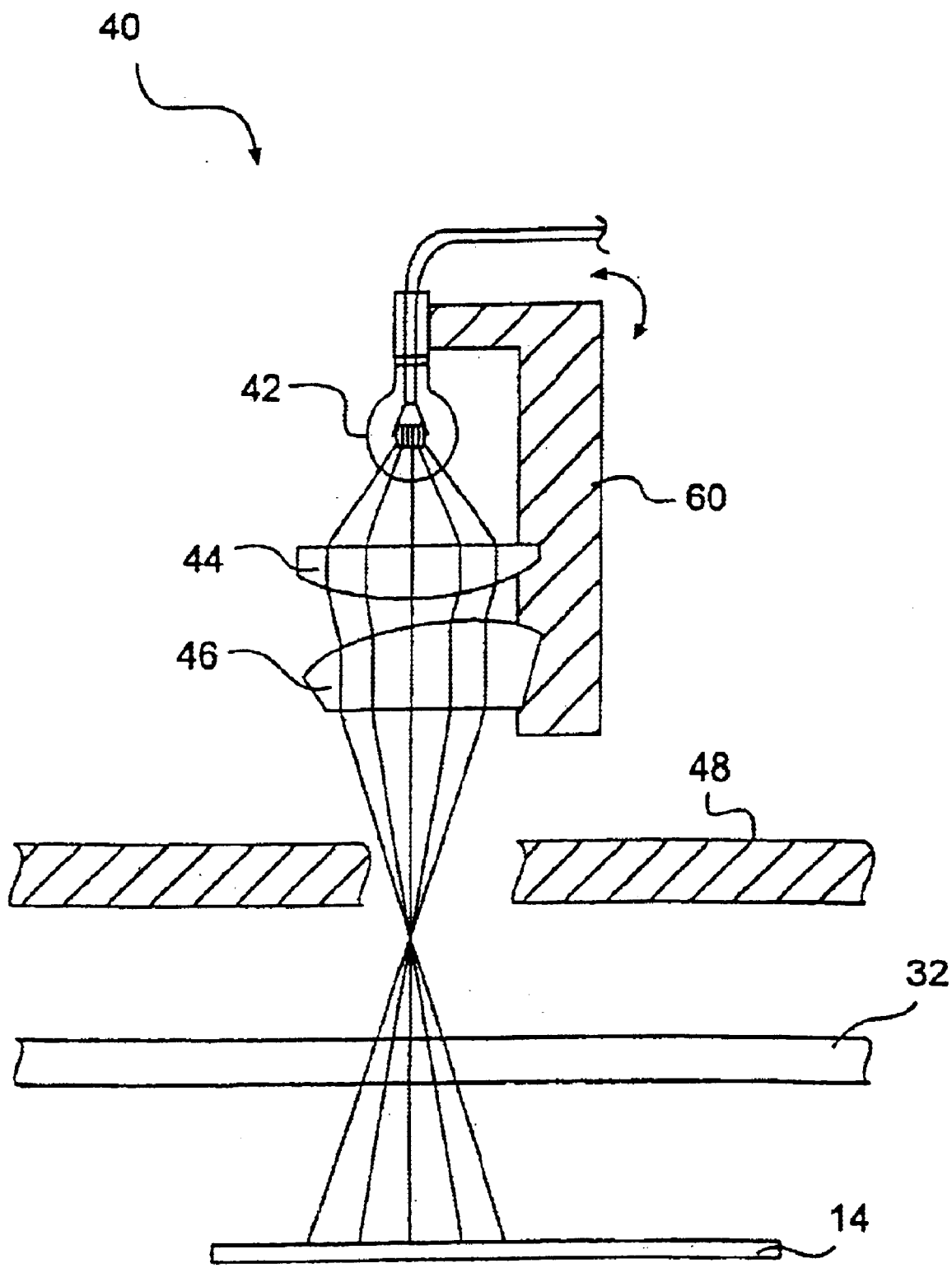
FIG. 3 is a cross sectional view of one embodiment of a tuning device for use in the present invention.

As shown particularly in FIG. 3, tuning device 40 includes a light energy source 42 that is spaced a predetermined distance from a first focusing lens 44 and a second focusing lens 46. Focusing lenses 44 and 46 are designed to focus a beam of light energy being emitted by light energy source 42 onto a desired location of a semiconductor wafer 14. In this embodiment, tuning device 40 is recessed in relation to lamps 24 shown in FIG. 2. Thus, as shown, tuning device 40 is placed behind an opening formed into a wall 48 of heating device 22. Wall 48 as shown in FIG. 2 is located behind lamps 24. It should be understood, however, that tuning device 40 can also be placed on the other side of wall 48 in the same plane as lamps 24.

As shown in FIG. 3, light energy source 42 and focusing lenses 44 and 46 can be mounted to a support structure 60. Support structure 60 can include a tiltable lever arm which allows for an adjustment to be made in the position of the tuning device. In particular, support structure 60 can be tilted for focusing light energy being emitted by the light energy source onto desired locations of wafer 14.

During operation, heating device 22 is preferably in communication with a system controller 50 as shown in FIG. 1. Based upon the temperature of the wafer being heated, system controller 50 can be designed to vary the amount of light energy being emitted by lamps 24 and by tuning devices 40. Each of the lamps that make up a concentric ring can be controlled together in order to form radial heating zones on the wafer. Tuning devices 40 on the other hand, can be controlled by system controller 50 independent of the concentric rings in a manner that enhances temperature uniformity throughout the wafer. System controller 50 can also be used to control support structure 60 for automatically directing light energy being emitted by tuning device 40 onto a desired location of the wafer.

Figure 8:
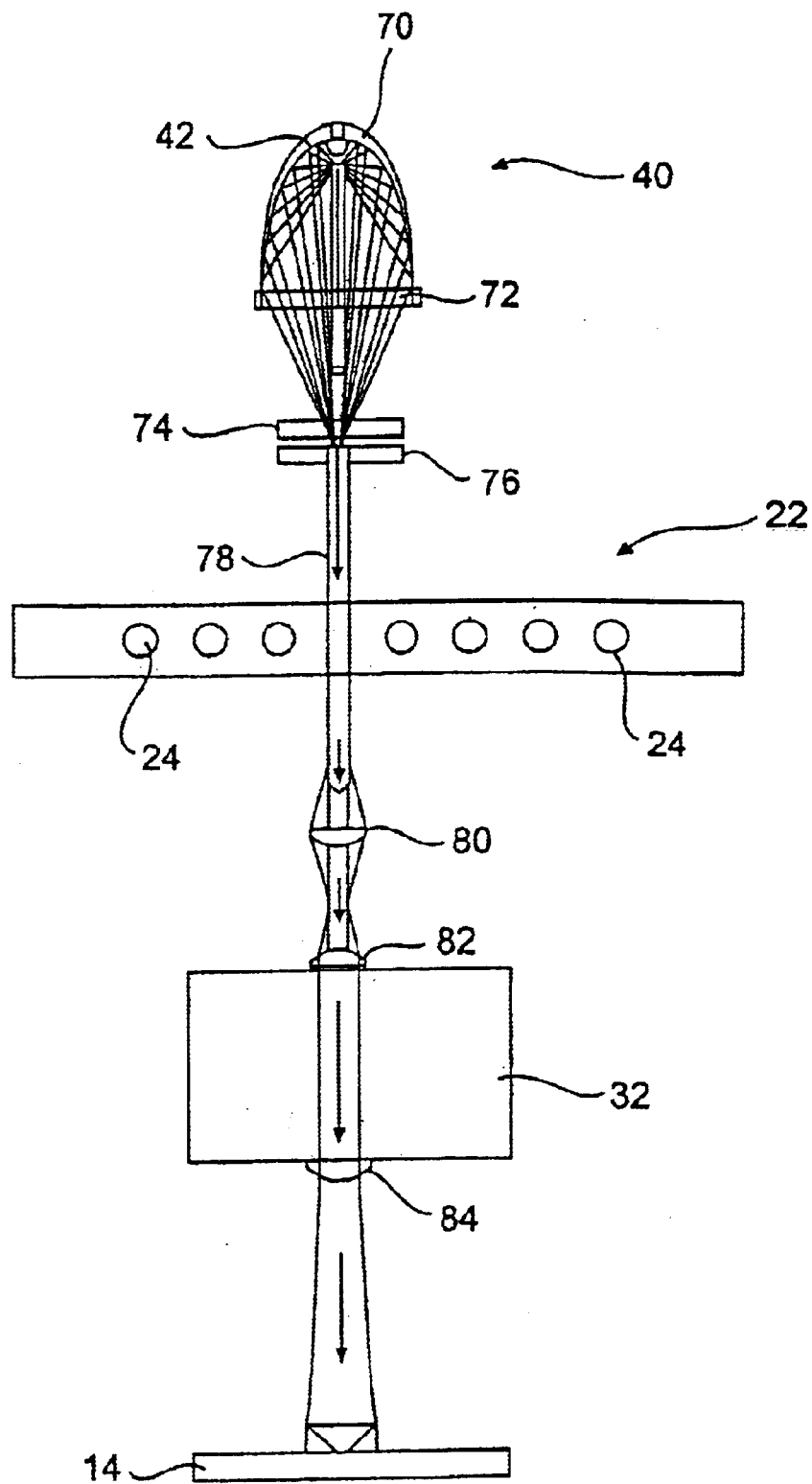
FIG. 8 is a side view of a further alternative embodiment of a tuning device made in accordance with the present invention.

Referring to FIG. 8, an alternative embodiment of a tuning device made in accordance with the present invention is illustrated. In this embodiment, like reference numerals have been used in order to indicate similar elements as shown is FIG. 3. As shown, tuning device 40 includes a light energy source 42 which transmits light to a wafer 14 in a thermal processing chamber through a window 32. Similar to FIG. 3, light energy source 42 is positioned above heating device 22, which includes a plurality of lamps 24, such as tungsten halogen lamps.

In this embodiment, light energy source 42 is an arc lamp that includes a cathode spaced from an anode. During operation, the cathode emits electrons that travel across the lamp arc gap and strike the anode. Arc lamps typically emit ultra violet light, infrared light, and visible light. The power level of the lamp can vary depending upon the particular application. Power levels from 125 watts to 1500 watts are available. Each of these power levels is actually a power range, with nominal power near the maximum. For most applications, however, the lamp should have a power level of from about 180 watts to about 320 watts.

As illustrated, arc lamp 42 is surrounded by a reflector 70. Reflector 70 preferably has a pure polycrystalline alumina body that is glazed with a high temperature material to give the reflector a specular surface. For instance, the reflector can be coated with a silver alloy for a visible lamp or an aluminum coating for a UV lamp and/or dielectric coating.

Reflector 70 surrounds the light energy source and can have various shapes. For instance, reflector 70 can be parabolic or elliptical. A parabolic reflector will create a collimated output beam, while an elliptical reflector will create a focused output. For most applications, preferably an elliptical reflector is used, because of its slightly better collection efficiencies and slightly shorter arc gap, while parabolic reflectors are usually used with focusing lenses.

During operation, preferably arc lamp 42 is cooled. For example the lamp can be cooled using forced air, free convention, conduction, or can be water cooled.

The cathode assembly and the anode assembly of arc lamp 42 are sealed within the reflector by a lamp window 72. Lamp window 72 can be made from, for instance, a ground and polished single-crystal sapphire.

As shown in the Figure, light emitted by arc lamp 42 is directed through a pair of apertures or "stops" 74 and 76 to block stray light. The reflector 70 focuses the light energy into a light pipe 78. One or more lenses are then used to focus the light out of the pipe and onto the wafer surface. Light pipe 78 is preferably made from a material that is well adapted for transmitting light and that is not substantially thermally conductive, such as quartz.

From light pipe 78, the light is passed through several focusing lenses prior contacting a semiconductor wafer 14. For instance, as shown in the embodiment illustrated in FIG. 8, the system includes a first focusing lens 80, a second focusing lens 82, and a third focusing lens 84 which is optional. Focusing lens 84 is positioned on the opposite side of window 32 within the thermal processing chamber in which the wafer is held. Focusing lenses 80, 82 and 84 are designed to facilitate transmission of light energy being emitted by arc lamp 42 and to focus the light onto a particular location of the wafer. In this embodiment, focusing lenses 80 and 82 comprise a condensing lens set. It should be understood, however, that the number and combination of lenses can vary depending on the application. For instance, the number of lenses can be reduced with careful lens design, such as by using an aspherical lens.

Tuning device 40 as shown in FIG. 8 can be used to heat various locations of the wafer. In one embodiment, however, it has been found that this configuration is particularly well adapted to heating the outer edges of the wafer, where the wafer tends to lose heat due to convection during heating cycles. In particular, it has been found that the system illustrated in FIG. 8 is particularly well adapted to heating the outer 3 to 5 millimeters of the wafer. It should be understood, however, that tuning device 40 can be positioned to heat other locations on the wafer.

The configuration illustrated in FIG. 8 represents one embodiment of a single tuning device using an arc lamp. It also should be understood that more than one tuning device may be used in a single system. Further, the location of the tuning device can vary. For instance, in an alternative embodiment, the tuning device can be below or on the side of the heater. Further, in one embodiment, wafer 14 can be heated from the top and the bottom with the tuning devices. For example, the wafer can be heated from the bottom using a separate heating device containing various tuning devices. Further, the tuning device can be arranged in a linear position with respect to the wafer or can assume an angular position with respect to the wafer.

Figure 4:
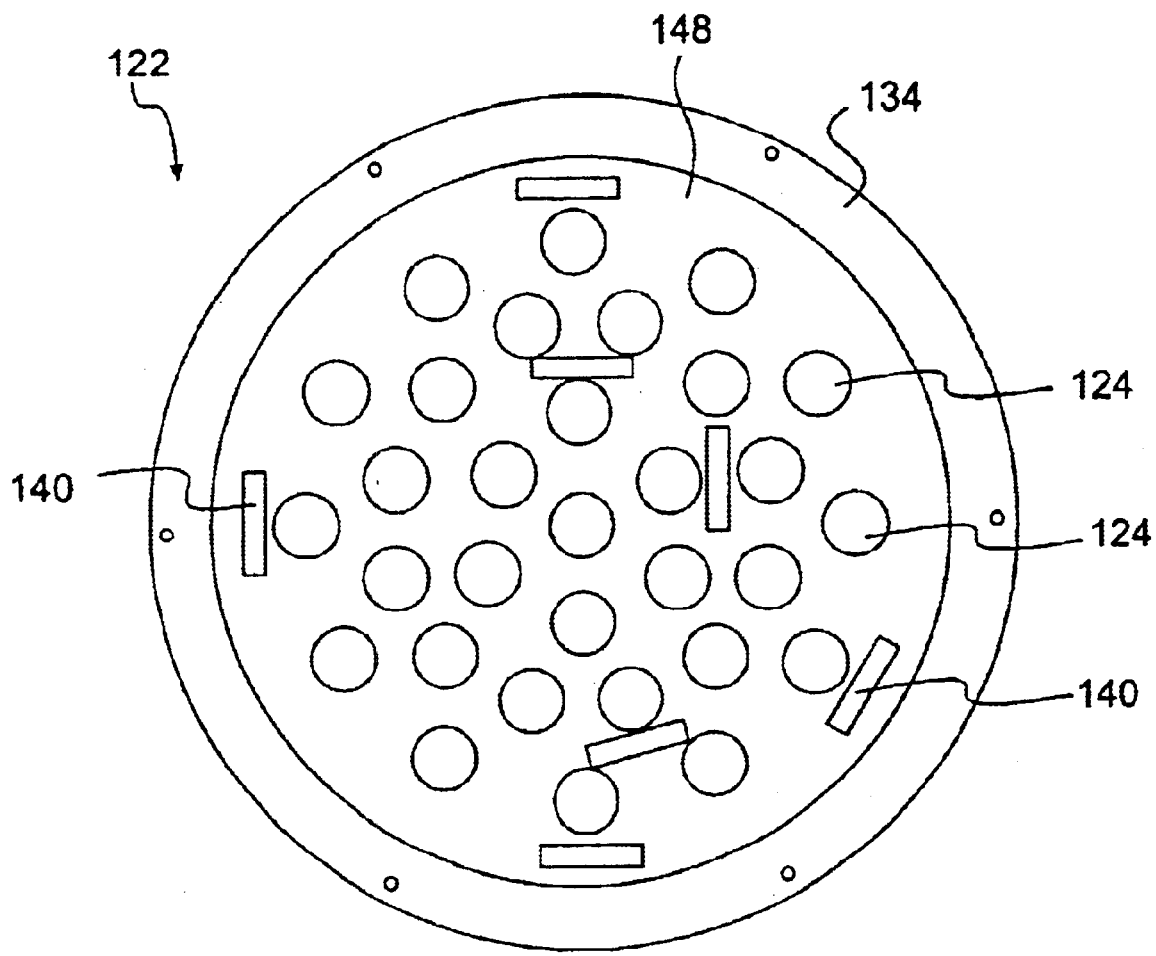
FIG. 4 is a plan view of an alternative embodiment of a heating device that may be used in thermal processing chambers in accordance with the present invention.

As described above, besides using localized active sources, the tuning devices of the present invention can also comprise passive sources which are used to adjust and vary the irradiance distribution of the heating lamps in a manner that enhances wafer temperature uniformity. One embodiment of a system using passive tuning devices is illustrated in FIG. 4. As shown, a heating device generally 122 for use in thermal processing chamber 12 as shown in FIG. 1 is illustrated. Heating device 122 includes an assembly of lamps 124 secured to a mounting base 134, which includes a base plate 148. In this embodiment, lamps 124 are spaced at various locations on mounting base 134 and are designed to form many different radial heating zones on a wafer.

In accordance with the present invention, heating device 122 further includes tuning devices 140 which are positioned adjacent to selected lamps. In this embodiment, tuning devices 140 are optical elements designed to redirect a portion of the radiant energy being emitted by the lamp assembly, thereby allowing fine adjustments to the irradiance distribution of the heater device onto a wafer located below the assembly.

In this particular embodiment, the optical elements are rectangular shaped and are inserted into heating device 122 generally near one or more of the lamps 124. Heater device 122 can be designed such that the depth of insertion of tuning devices 140 and the azimuthal angle of the tuning devices can be adjusted. For instance, tuning devices 140 can be inserted through an opening formed into base plate 148 and can be extended into the heater device any desired length in relation to the length of lamps 124. Similarly, in some systems, the angle at which the tuning devices are inserted can be adjusted.

The purpose of tuning devices 140 is to cause the radiation being emitted from lamps 124 to deviate from an original azimuthal direction of propagation in order to modify the radial power distribution on the wafer. Desirably, the light energy being emitted by the lamps exits heater device 122 sooner than it would otherwise without tuning devices 140 and will hit and contact the wafer at a different radial location than it would otherwise. By selectively varying the location of tuning devices 140, the wafer can be heated under a more controlled and uniform temperature regime.

In order to redirect the light energy that is being emitted by lamps 124, tuning devices 140 include at least one surface having desired optical characteristics. In modifying the irradiance distribution of the lamps, tuning devices 140 can either reflect light energy, refract light energy, or can even absorb light energy.

Figure 5:
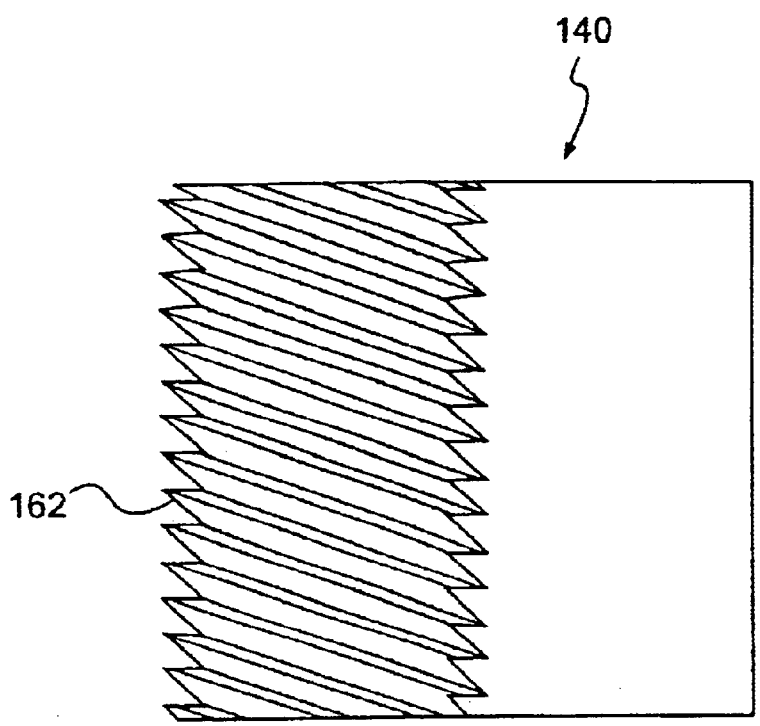
FIG. 5 is a partial perspective view of an alternative embodiment of a tuning device made in accordance with the present invention.

One preferred embodiment of a tuning device 140 that can be used to reflect light energy in a desired manner is illustrated in FIG. 5. As shown, tuning device 140 includes a ruled prismatic surface 162. As shown, surface 162 is serrated and mirrored. The prismatic surface illustrated in FIG. 5 employs a fixed pitch with a fixed facet angle. It should be understood, however, that the surface could also employ a fixed pitch with a variable facet angle.

By including a ruled prismatic surface, tuning device 140 causes radiant energy contacting the device to exit heater device 122 sooner than would otherwise occur. This device alters the radial irradiance distribution of the system in a way that can be finely adjusted over some preestablished range.

Figure 6:
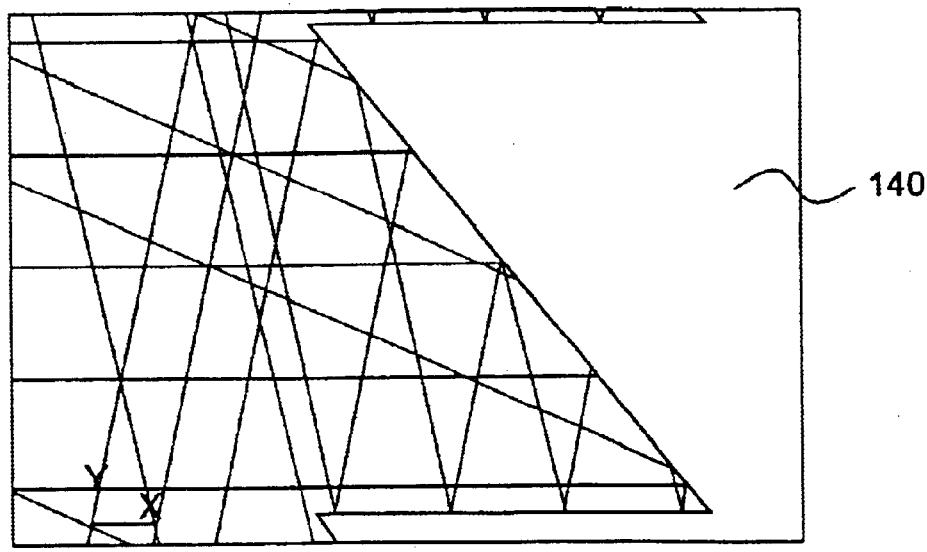
FIG. 6 is an enlarged portion of the tuning device shown in FIG. 5 illustrating how light energy may be reflected off the surface of the device.

Referring to FIG. 6, a simplified detail of light energy reflecting off of one facet of tuning device 140 is illustrated. As shown, horizontal rays incoming from the left of surface 162 contact the tuning device and exit with a dramatically different vertical orientation. As described above, besides using a fixed facet angle, tuning device 140 can also be made with a variable angle design. When using a variable angle design, tuning device 140 can be used to more accurately focus light radiation contacting surface 162 and more accurately redirect the light energy onto a particular location on the wafer being heated if desired.

It should be understood, however, that numerous other surface structures are possible. For instance, in an alternative design, surface 162 of tuning device 140 can be planar and diffusing, causing light energy contacting the surface to scatter in all directions. For instance, a highly diffuse surface may be a rough but highly reflective surface on tuning device 140. Using a diffuse surface may be less costly to produce but may not provide a similar amount of control as using a prismatic surface.

As stated above, tuning device 140 can be designed to either reflect light radiation, refract light radiation or absorb light radiation. When used to reflect light radiation, preferably tuning device 140 is coated with a highly reflective material, such as a dielectric material or a polished metal, such as gold, copper, or aluminum. When used to refract or absorb light energy, tuning device 140 can be made, for instance, from quartz.

In further embodiments, the tuning device of the present invention can be a combination of active (e.g. lamps) and passive (e.g. light guide structures) devices such that the relative position of the active and passive devices can be adjusted as a function of time and/or temperature or temperature homogeneity across the wafer while processing the wafer in the process chamber.

An example of such a tuning device includes a lamp in a light guide structure similarly as mentioned above. For instance, the light guide structure can be a cylindrically shaped reflector. In such a combination, the position of the lamps withing the cylindrically shaped reflectors is adjusted while processing the wafer. Specifically, the lamp could stay in a fixed position and the reflector or light guide structure could be adjusted, or alternatively, the lamp can be adjustable within the reflector. It is also possible that both the active and passive devices are adjusted relative to the wafer. In general, adjustment of the adjusting device translates into a change in the relative position of the active and/or the passive device relative to the wafer.

The light guide structure used in the present invention can have any suitable cross section or shape. For instance, the light guide structure can have a circular cross section, a square cross section or any other shape. Further, instead of being perfectly cylindrical, the light guide structure can also have a conical or arbitrary shape, guiding the light from the active device onto a particular location of the wafer.

The present invention may be better understood with reference to the following example.

EXAMPLE

The following example was conducted in order to demonstrate how a tuning device made in accordance with the present invention can be used to change the irradiance distribution of light energy sources.

A prismatic tuning device similar to the one illustrated in FIG. 5 was inserted into an array of light energy sources in a thermal processing chamber. The array of light energy sources included five concentric rings of vertically orientated lamps mounted to a base, similar to the heating device illustrated in FIG. 4. The prismatic tuning device was positioned adjacent one of the lamps located on the second concentric ring from the center of the array of lamps.

Figure 7:
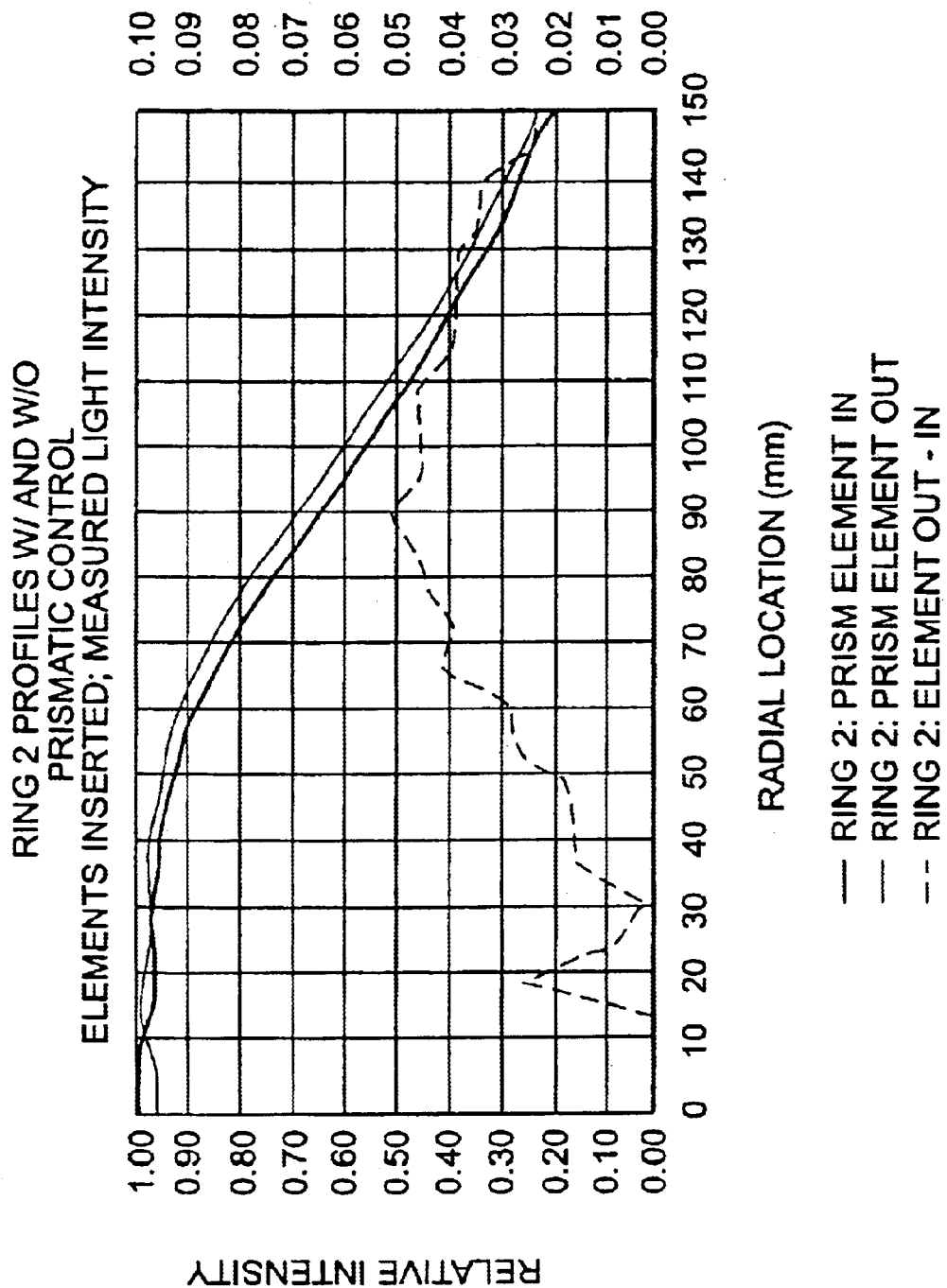
FIG. 7 is a graphical representation of the results obtained in the Example which follows.

Specifically, in this example, only the second concentric ring of lamps was turned on in order to measure its effect. Light intensity was then measured at different radial locations at the same distance from the light source as the semiconductor wafer would be placed. In particular, light intensity was measured when the tuning device was positioned adjacent to one of the light energy sources and when the tuning device was absent from the heating device. The results of the example are illustrated in FIG. 7. Also illustrated in the Figure is a graph of the difference in relative intensity between when the prismatic element was inserted and when it was not. (The scale for the difference is on the Y axis on the right.)

As shown by the figure, inclusion of the tuning device of the present invention changed the irradiance distribution of the light energy sources. Of particular advantage, the tuning device only slightly modified the irradiance distribution. In this manner, the tuning device of the present invention is well suited to making fine adjustments in the manner in which a wafer is illuminated in order to promote temperature uniformity.

These and other modifications and variations to the present invention may be practiced by those of ordinary skill in the art, without departing from the spirit and scope of the present invention, which is more particularly set forth in the appended claims. In addition, it should be understood that aspects of the various embodiments may be interchanged both in whole or in part. Furthermore, those of ordinary skill in the art will appreciate that the foregoing description is by way of example only, and is not intended to limit the invention so further described in such appended claims.

What is claimed is:

1. An apparatus for heat treating semiconductor wafers comprising:
    a thermal processing chamber adapted to contain a semiconductor wafer; and
    a heating device in communication with said thermal processing chamber for heating a semiconductor wafer contained in said chamber, said heating device comprising:
        (a) a plurality of light energy sources configured to emit light energy onto said semiconductor wafer, said light energy sources being positioned so as to form an irradiance distribution across a surface of said wafer; and
        (b) at least one adjustable tuning device positioned amongst said light energy sources, said tuning device being configured to operate in conjunction with the plurality of light energy sources to change the irradiance distribution of said light energy sources in a manner for more uniformly heating said semiconductor wafer, said tuning device comprising an arc lamp.

2. An apparatus as defined in claim 1, wherein said tuning device further comprises at least one focusing lens, said focusing lens being configured to focus light energy being emitted by said arc lamp.

3. An apparatus as defined in claim 2, further comprising a light pipe positioned in between said arc lamp and said at least one focusing lens.

4. An apparatus as defined in claim 1, wherein said tuning device positioned to heat the outermost edges of said semiconductor wafer.

5. An apparatus as defined in claim 1, wherein said arc lamp is surrounded by a reflector.

6. An apparatus as defined in claim 5, wherein said reflector has an elliptical shape.

7. An apparatus as defined in claim 1, further comprising:
    at least one temperature sensing device for sensing the temperature of said semiconductor wafer at least at one location; and
    a controller in communication with said at least one temperature sensing device and at least one of said light energy sources, said controller being configured to control the amount of light energy being emitted by said at least one light energy source in response to temperature information received from said at least one temperature sending device.

8. An apparatus as defined in claim 1, further comprising a substrate holder for holding said semiconductor wafer, said substrate holder being configured to rotate said wafer.

9. An apparatus for heat treating semiconductor wafers comprising:
    a thermal processing chamber adapted to contain a semiconductor wafer; and
    a heating device in communication with said thermal processing chamber for heating a semiconductor wafer contained in said chamber, said heating device comprising a plurality of light energy sources configured to emit light energy onto said semiconductor wafer, said light energy sources being positioned so as to form an irradiance distribution across a surface of said wafer, and at least one tuning device positioned amongst said light energy sources, said tuning device comprising a light source spaced from at least one focusing lens, said focusing lens being configured to focus light energy being emitted by said light energy source onto a determined location on said semiconductor wafer in a manner that more uniformly heats said semiconductor wafer, said tuning device comprising an arc lamp.

10. An apparatus as defined in claim 9, further comprising:
    at least one temperature sensing device for sensing the temperature of said semiconductor wafer at least at one location; and
    a controller in communication with said temperature sensing device, with at least one of said light energy sources, and with said tuning device, said controller being configured to control the amount of light energy being emitted by said at least one light energy source and said tuning device in response to temperature information received from said temperature sensing device.

11. An apparatus as defined in claim 10, wherein said controller is configured to control the amount of light energy being emitted by said at least one tuning device independently of said light energy sources.

12. An apparatus as defined in claim 9, further comprising a light pipe positioned in between said arc lamp and said at least one focusing lens.

13. An apparatus as defined in claim 9, wherein said tuning device is positioned to heat the outermost edges of said semiconductor wafer.

14. An apparatus as defined in claim 9, wherein said arc lamp is surrounded by a reflector.

15. An apparatus as defined in claim 14, wherein said reflector has an elliptical shape.

* * * * *

UNITED STATES PATENT AND TRADEMARK OFFICE
CERTIFICATE OF CORRECTION

PATENT NO. : 6,717,158 B1
DATED : April 6, 2004
INVENTOR(S) : Arnon Gat et al.

It is certified that error appears in the above-identified patent and that said Letters Patent is hereby corrected as shown below:

Title page,
Item [56], References Cited, FOREIGN PATENT DOCUMENTS, reads "EP 4306398 A" should read -- DE 4306398 Al --

Column 14,
Line 33, "sending" should read -- sensing --

Signed and Sealed this

Twenty-first Day of June, 2005

JON W. DUDAS
*Director of the United States Patent and Trademark Office*